United States Patent
Shank et al.

(10) Patent No.: US 10,062,711 B2
(45) Date of Patent: Aug. 28, 2018

(54) WAFERS AND DEVICE STRUCTURES WITH BODY CONTACTS

(71) Applicant: GLOBALFOUNDRIES Inc., Grand Cayman (KY)

(72) Inventors: Steven Shank, Jericho, VT (US); Alvin Joseph, Williston, VT (US); Michel Abou-Khalil, Essex Junction, VT (US); Michael Zierak, Colchester, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/386,507

(22) Filed: Dec. 21, 2016

(65) Prior Publication Data

US 2018/0175064 A1 Jun. 21, 2018

(51) Int. Cl.
| | | |
|---|---|---|
| H01L 27/12 | (2006.01) | |
| H01L 21/00 | (2006.01) | |
| H01L 21/84 | (2006.01) | |
| H01L 29/06 | (2006.01) | |
| H01L 23/528 | (2006.01) | |
| H01L 29/423 | (2006.01) | |
| H01L 21/762 | (2006.01) | |
| H01L 21/683 | (2006.01) | |

(52) U.S. Cl.
CPC ...... *H01L 27/1203* (2013.01); *H01L 21/6835* (2013.01); *H01L 21/76283* (2013.01); *H01L 21/84* (2013.01); *H01L 23/528* (2013.01); *H01L 29/0649* (2013.01); *H01L 29/4238* (2013.01); *H01L 2221/6835* (2013.01)

(58) Field of Classification Search
CPC .................................................. H01L 21/1203
USPC .......................................... 257/347; 438/151
See application file for complete search history.

(56) References Cited

U.S. PATENT DOCUMENTS

| | | | |
|---|---|---|---|
| 6,437,405 B2 | 8/2002 | Kim | |
| 6,441,435 B1 | 8/2002 | Chan | |
| 6,469,350 B1 | 10/2002 | Clark, Jr. et al. | |
| 8,409,989 B2 | 4/2013 | Pei et al. | |
| 9,425,213 B1* | 8/2016 | Liu | H01L 27/1211 |
| 2007/0202635 A1* | 8/2007 | Ellis-Monaghan | H01L 21/76264 438/149 |
| 2011/0169051 A1* | 7/2011 | Bangsaruntip | H01L 21/2007 257/192 |
| 2013/0056799 A1* | 3/2013 | Ishizu | G06F 17/5036 257/213 |
| 2013/0134518 A1* | 5/2013 | Botula | H01L 21/84 257/350 |

(Continued)

*Primary Examiner* — Igwe U Anya
(74) *Attorney, Agent, or Firm* — Thompson Hine LLP; Michael LeStrange

(57) ABSTRACT

Wafers for fabrication of devices that include a body contact, device structures with a body contact, methods for forming a wafer that supports the fabrication of devices that include a body contact, and methods for forming a device structure that includes a body contact. The wafer includes a buried oxide layer and a semiconductor layer on the buried oxide layer. The semiconductor layer includes a section with a top surface and a plurality of islands projecting from the section of the semiconductor layer into the buried oxide layer. The section of the semiconductor layer is located vertically between the islands of the semiconductor layer and the top surface of the semiconductor layer.

19 Claims, 6 Drawing Sheets

(56) References Cited

U.S. PATENT DOCUMENTS

2015/0004438 A1\* 1/2015 Takizawa ............... G11B 5/855
428/832

\* cited by examiner

WAFERS AND DEVICE STRUCTURES WITH BODY CONTACTS

BACKGROUND

The present invention relates to semiconductor device fabrication and integrated circuits and, more specifically, to wafers for fabrication of devices that include a body contact, device structures with a body contact, methods for forming a wafer that supports the fabrication of devices that include a body contact, and methods for forming a device structure that includes a body contact.

Complementary-metal-oxide-semiconductor (CMOS) processes may be used to build a combination of p-type field-effect transistors (pFETs) and n-type field-effect transistors (nFETs) that are coupled to implement logic gates and other types of integrated circuits, such as switches. Field-effect transistors generally include an active semiconductor region, a source and a drain defined in the active semiconductor region, and a gate electrode associated with a channel in the active semiconductor region. When a control voltage exceeding a designated threshold voltage is applied to the gate electrode, carrier flow occurs in an inversion or depletion layer in the channel between the source and drain to produce a device output current.

Silicon-on-insulator (SOI) substrates may be advantageous in CMOS technology. In comparison with field-effect transistors built using a bulk silicon wafer, a silicon-on-insulator substrate permits operation at significantly higher speeds with improved electrical isolation and reduced electrical losses. Contingent on the thickness of the device layer of the SOI substrate, a field-effect transistor may operate in a partially-depleted mode in which the depletion layer in the channel within the device layer does not extend fully to the buried oxide layer when typical control voltages are applied to the gate electrode.

Partially-depleted SOI field-effect transistors may be fabricated with two varieties, namely either floating-body SOI field-effect transistors or body-contacted SOI field-effect transistors. A floating-body SOI field-effect transistor conserves device area due to its comparatively small size, but suffers from the floating body effect due to the absence of a body contact. A floating-body SOI field-effect transistor may be unstable during operation, especially when operating in a radiofrequency circuit or a high speed digital circuit, because the threshold voltage is a function of a fluctuating body voltage. A body-contacted SOI field-effect transistor includes a body contact that may eliminate floating body effects. However, a body-contacted SOI field-effect transistor consumes more chip area than a floating-body SOI field-effect transistor, which reduces the density of a circuit built using body-contacted SOI field-effect transistors in comparison with a circuit built using floating-body SOI field-effect transistors.

Improved wafers for fabrication of devices that include a body contact, device structures with a body contact, methods for forming a wafer that supports the fabrication of devices that include a body contact, and methods for forming a device structure that includes a body contact are needed.

SUMMARY

In an embodiment of the invention, a method includes forming a cleavage plane in a first wafer that is separated from a surface of the first wafer by a semiconductor layer, patterning a surface of the first wafer to form a plurality of trenches in the semiconductor layer, and depositing a dielectric layer that fills the trenches and covers the semiconductor layer. The method further includes transferring the dielectric layer and the semiconductor layer to a second wafer by bonding the dielectric layer to a second wafer and separating along the cleavage plane.

In an embodiment of the invention, a structure includes a handle wafer, a buried oxide layer on the handle wafer, and a semiconductor layer on the buried oxide layer. The semiconductor layer includes a section with a top surface and a plurality of islands projecting from the section of the semiconductor layer into the buried oxide layer. The section of the semiconductor layer is located vertically between the islands of the semiconductor layer and the top surface of the semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
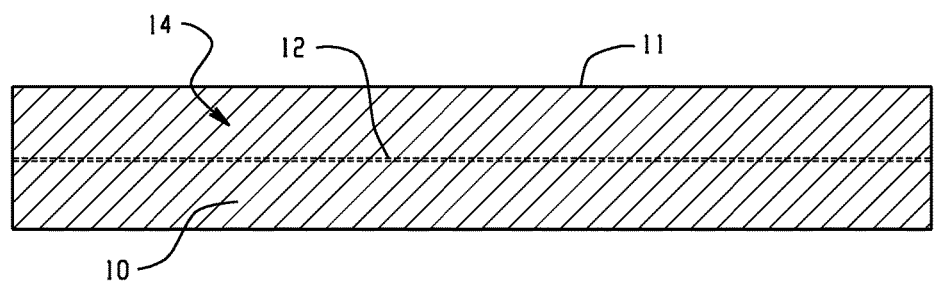
FIGS. 1-5 are cross-sectional views of a substrate at successive stages of the processing method in accordance with embodiments of the invention.

With reference to FIG. 1 and in accordance with embodiments of the invention, a donor wafer 10 may be a bulk substrate comprised of silicon, which may be lightly doped to have p-type conductivity. The donor wafer 10 is ion implanted using an ion implantation process to create an implanted band 12. The ions used to form the implanted band 12 may be generated from a suitable source gas and implanted using an ion implantation tool. The implantation conditions (e.g., ion species, dose, kinetic energy, angle of incidence) are selected to deliver the ions with a given concentration profile at the location of the damage band 12. For example, the ion species may be positive hydrogen ions generated from hydrogen ($H_2$) as a source gas. The stopped ions will have a depth profile in which the atomic concentration and lattice structure damage are distributed primarily across the thickness of the implanted band 12.

A semiconductor layer 14 comprising a portion of the donor wafer 10 located generally between the implanted band 12 and the top surface 11 of the donor wafer 10. The thickness of the semiconductor layer 14 is determined at least in part by the depth of the implanted band 12 relative to the top surface 11 of the donor wafer 10. The implanted band 12, after a suitable thermal treatment at a temperature of, for example, 700° C. to 1100° C., changes the mechanical properties of the semiconductor material of the donor wafer 10. The implanted band 12 defines a cleaving plane that can be fractured and used to remove the donor wafer 10 as part of an process transferring the semiconductor layer 14 to a different substrate.

Figure 2:
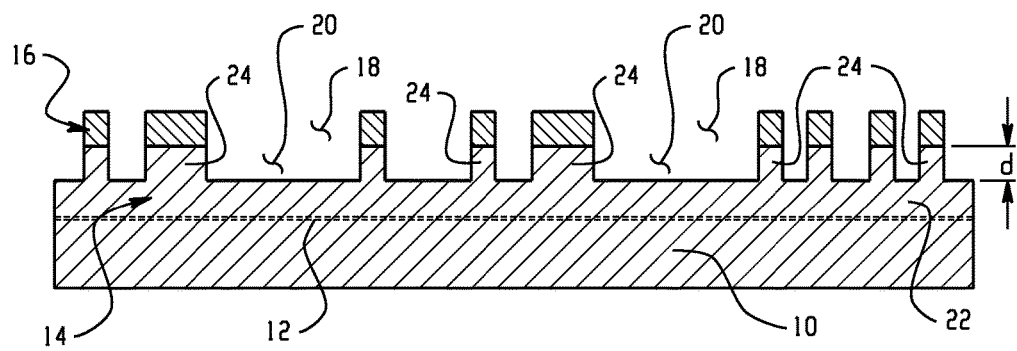

With reference to FIG. 2 in which like reference numerals refer to like features in FIG. 1 and at a subsequent fabrication stage, a resist layer 16 is formed as a sacrificial film on the semiconductor layer 14 and patterned to form openings 18. Specifically, the resist layer 16 may be composed of an organic photoresist that is applied by spin-coating, pre-baked, exposed to a pattern of radiation from an exposure source projected through a photomask, baked after exposure, and developed with a chemical developer to form the openings 18 situated at the intended locations for corresponding trenches 20 to be formed in the semiconductor layer 14.

The semiconductor layer 14 may be removed at the locations of the openings 18 by an etching process using an etch chemistry selected to pattern the constituent material of the semiconductor layer 14. The trenches 20 are formed at the location of the openings 18. The depth, d, of the trenches 20 penetrates vertically only partially through the semiconductor layer 14 without reaching the implanted band 12, and is achieved through control over the etching process. For example, the trenches 20 may penetrate two-thirds of the way through the semiconductor layer 14. After the semiconductor layer 14 is patterned, the resist layer 16 is stripped by, for example, ashing.

A section 22 of the semiconductor layer 14 is located vertically between the trenches 20 and the implanted band 12. The section 22 of the semiconductor layer 14 may have a uniform thickness and is not etched when the trenches 20 are formed. Islands 24 of the semiconductor layer 14 are located horizontally between adjacent trenches 20 and vertically between the section 22 of the semiconductor layer 14 and the top surface 11 of the donor wafer 10. The islands 24 are arranged in a pattern that is the inverse or reciprocal of the pattern in which the trenches 20 are arranged.

In the representative embodiment, the pattern of the trenches 20 and islands 24 may be selected to be arbitrary, and the width of the islands 24 may be randomly chosen. However, in alternative embodiments, the pattern selected for the islands 24 may have a higher degree of order in its arrangement, such as a grid arrangement or a framed grid arrangement. For example, the pattern for the islands 24 may be chosen based on prior knowledge of the layout for device structures to be subsequently formed using the section 22 of semiconductor layer 14. In an embodiment, the layout for the device structures may be a switch, and the pattern for the islands 24 may reflect the switch layout.

Figure 3:
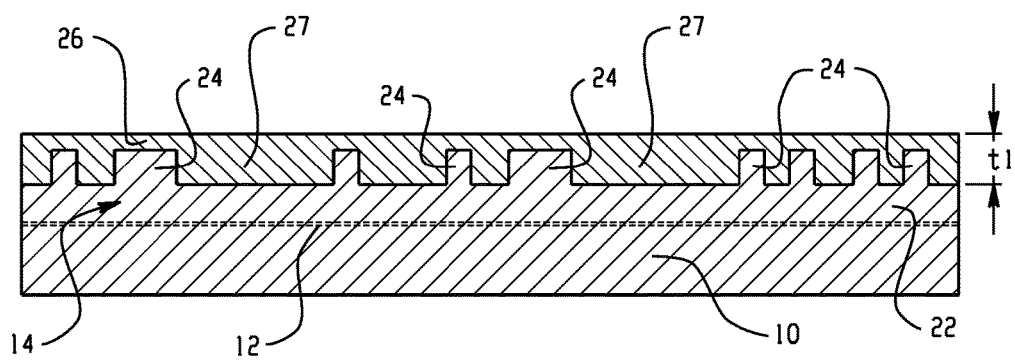

With reference to FIG. 3 in which like reference numerals refer to like features in FIG. 2 and at a subsequent fabrication stage, a dielectric layer 26 is formed that fills the trenches 20 and that has a thickness, t1, selected to cover the islands 24. The dielectric layer 26 may be composed of a dielectric material, such as silicon dioxide ($SiO_2$) deposited by chemical vapor deposition (CVD). The dielectric layer 26 may be formed by depositing a layer of its constituent material, planarizing the layer with, for example, chemical mechanical polishing (CMP). The dielectric layer 26 may have a total thickness that fills the trenches 20 and covers the islands 24 with at least a thickness equal to the depth of the trenches 20.

Portions 27 of the dielectric layer 26 fill the trenches 20 (FIG. 2) and laterally separate the adjacent pairs of islands 24. Each island 24 is surrounded on multiple sides by the dielectric material of the dielectric layer 26, and has one side that is connected with the section 22 of the semiconductor layer 14. The islands 24 are arranged in a pattern that is the inverse or reciprocal of the pattern in which the portions 27 of the dielectric layer 26 are arranged, which arises from a similar spatial relationship between the trenches 20 (FIG. 2) and the islands 24.

Figure 4:
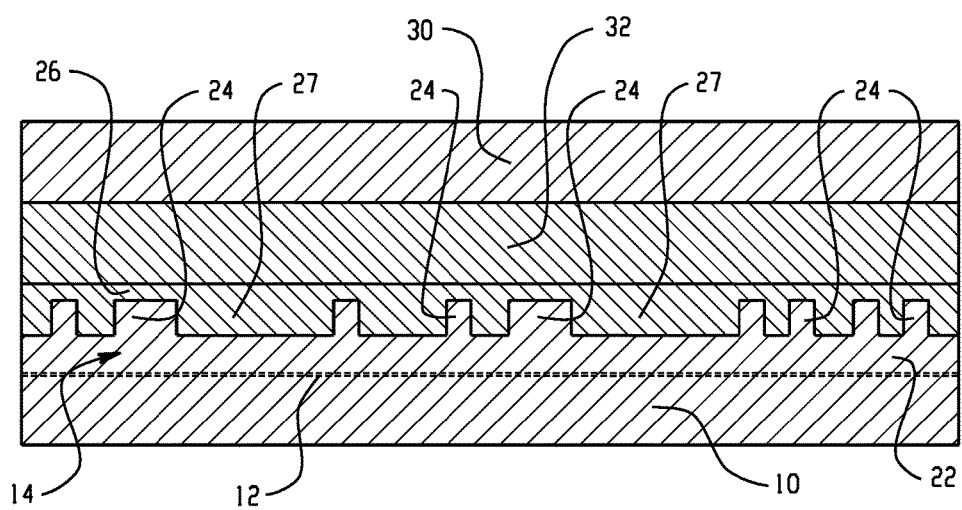

With reference to FIG. 4 in which like reference numerals refer to like features in FIG. 3 and at a subsequent fabrication stage, a handle wafer 30 that includes a dielectric layer 32 at its top surface may be bonded to the dielectric layer 26. The dielectric layers 26, 32 may each have a flat, smooth finish that promotes bonding. To that end, the donor wafer 10 and handle wafer 30 may be maneuvered such that the dielectric layer 26 on the donor wafer 10 contacts the dielectric layer 32 carried on the handle wafer 30. The donor wafer 10 and handle wafer 30 are then bonded together by a bonding process that may involve a thermal anneal at a sufficient temperature (e.g., 500° C. to 800° C.) and for a duration sufficient to cause bonding between the dielectric layers 26, 32. The donor wafer 10 and handle wafer 30 may be clamped together during the thermal anneal by an external force applying a mechanical pressure to force the dielectric layer 26 into intimate contact with the dielectric layer 32.

In various embodiments, the handle wafer 30 may be an engineered high-resistance wafer comprised of high-resistance silicon, sapphire, quartz, alumina, etc. The donor wafer 10, which may be an inexpensive substrate (e.g., a common silicon wafer), is present during processing to fabricate the device structures of a chip and is then replaced by the handle wafer 30 to provide a final assembly. Device structures fabricated using the semiconductor layer 14 may exhibit improved performance metrics because of the replacement of the donor wafer 10 with the handle wafer 30.

The handle wafer 30 may be modified by adding a layer comprised of a trap-rich material, such as a polycrystalline semiconductor material like polysilicon or another type of engineered low-mobility silicon layer, that may be deposited by CVD. The CVD deposition conditions (e.g., temperature and pressure) may be selected to impart a high density of electrically-active carrier traps to the added layer.

Figure 5:
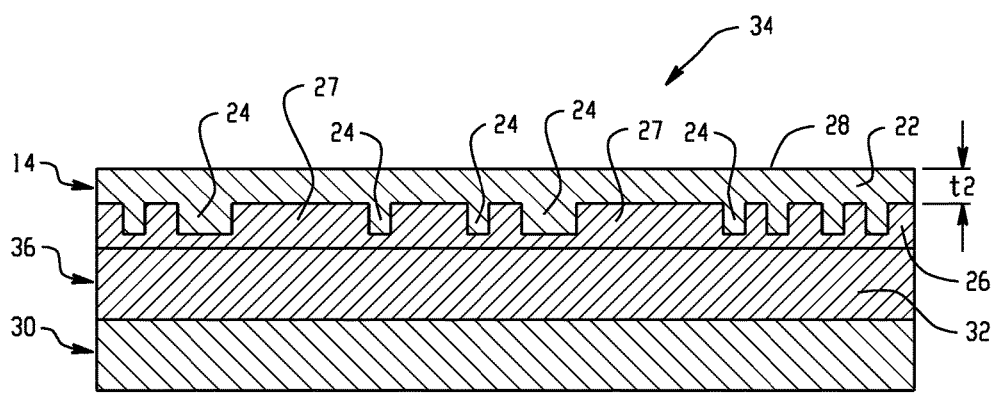

With reference to FIG. 5 in which like reference numerals refer to like features in FIG. 4 and at a subsequent fabrication stage, the donor wafer 10 is cleaved at the location of the implanted band 12 to release the semiconductor layer 14 from the donor wafer 10. Cleavage along the implanted band 12 may be mechanically assisted by, for example, the use of a water jet to initiate a fracture that propagates across the implanted band 12 and results in separation of the semiconductor layer 14 from the remainder of the donor wafer 10. The released semiconductor layer 14 is transferred from the donor wafer 10 to the handle wafer 30 to form a silicon-on-insulator (SOI) wafer or substrate 34. The top surface of the section 22 of the semiconductor layer 14 may be polished by, for example, CMP process to improve flatness and smoothness, and to impart a given final thickness to section 22.

The section 22 of the semiconductor layer 14 defines an SOI layer (i.e., a device layer) that may be used in front-end-of-the-line (FEOL) processing to fabricate device structures. The bonded dielectric layers 26, 32 combine to form a buried oxide (BOX) layer 36 of the SOI substrate 34, which is disposed between the handle wafer 30 and the semiconductor layer 14. The BOX layer 36 has a total thickness that is equal to the sum of the thickness of the dielectric layer 26 and the thickness of the dielectric layer 32. The handle wafer 30 supplies mechanical robustness and facilitates handling of the SOI substrate 34.

The semiconductor layer 14 has a top surface 28 resulting from the layer transfer, and the islands 24 of semiconductor layer 14 are located vertically between the top surface 28 and the BOX layer 36. The islands 24 are patterned in the semiconductor layer 14, before the SOI substrate 34 is formed by layer transfer techniques, and introduce irregularities in the BOX layer 36 such that the interface between the BOX layer 36 and the section 22 of semiconductor layer 14 is non-planar. The islands 24 of semiconductor layer 14 may be used to form a buried body contact.

Figure 6:
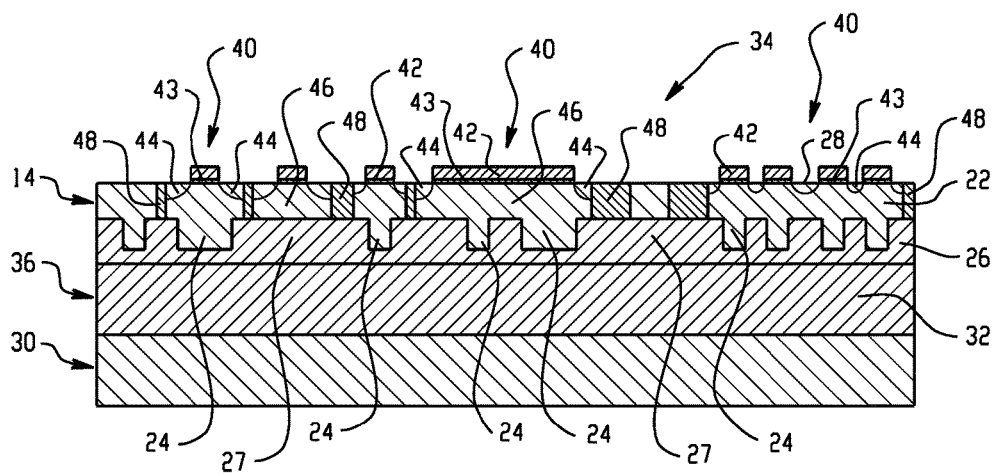
FIG. 6 is a cross-sectional view of the substrate of FIG. 5 following the formation of body-contacted device structures in accordance with embodiments of the invention
Figure 7:
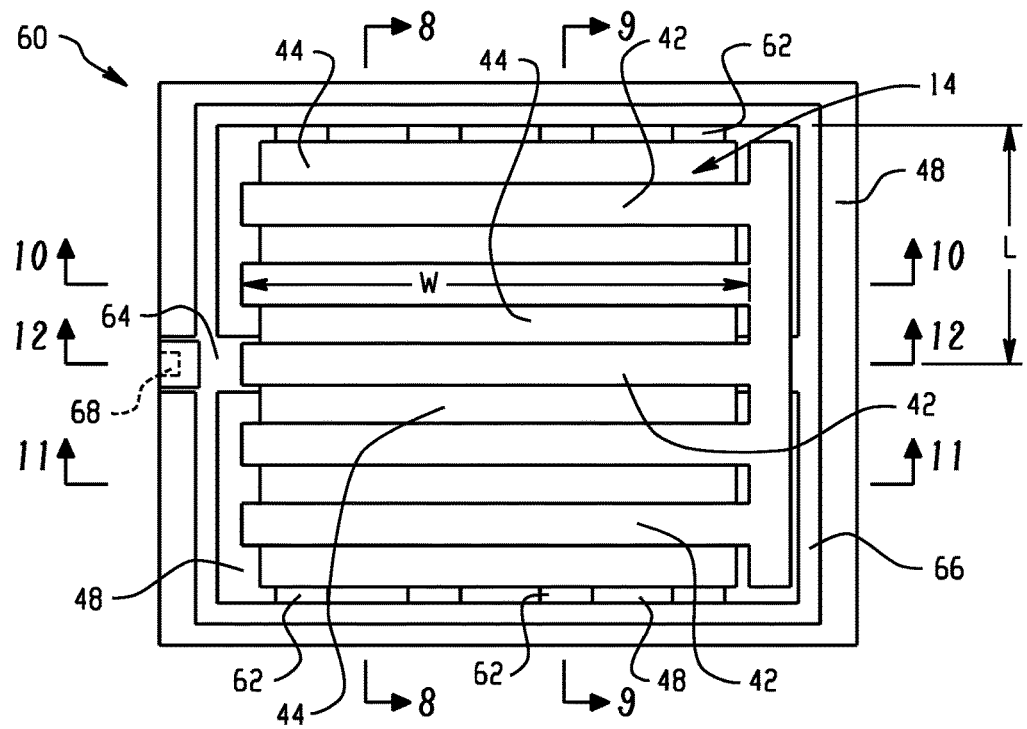
FIG. 7 is a top view of body-contacted device structures forming a switch and a substrate in accordance with embodiments of the invention.
Figure 8:
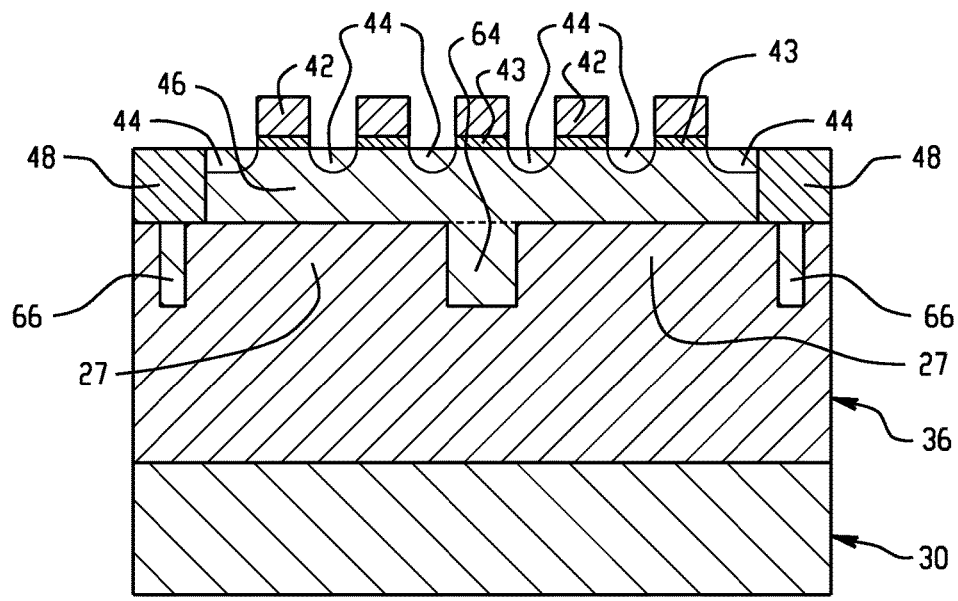
FIG. 8 is a cross-sectional view taken generally along line 8-8 in FIG. 7.
Figure 9:
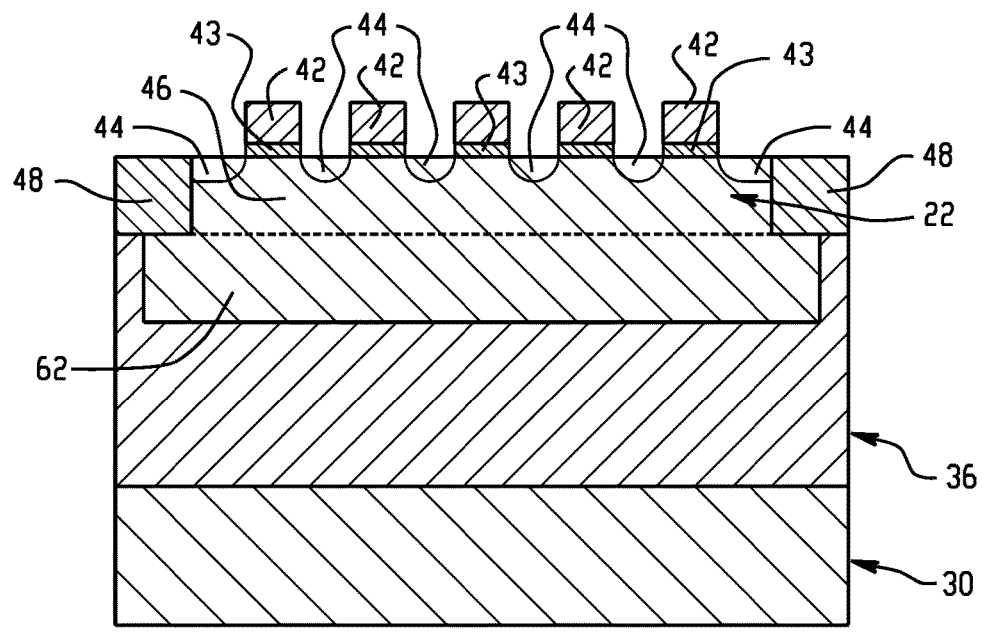
FIG. 9 is a cross-sectional view taken generally along line 9-9 in FIG. 7.
Figure 10:
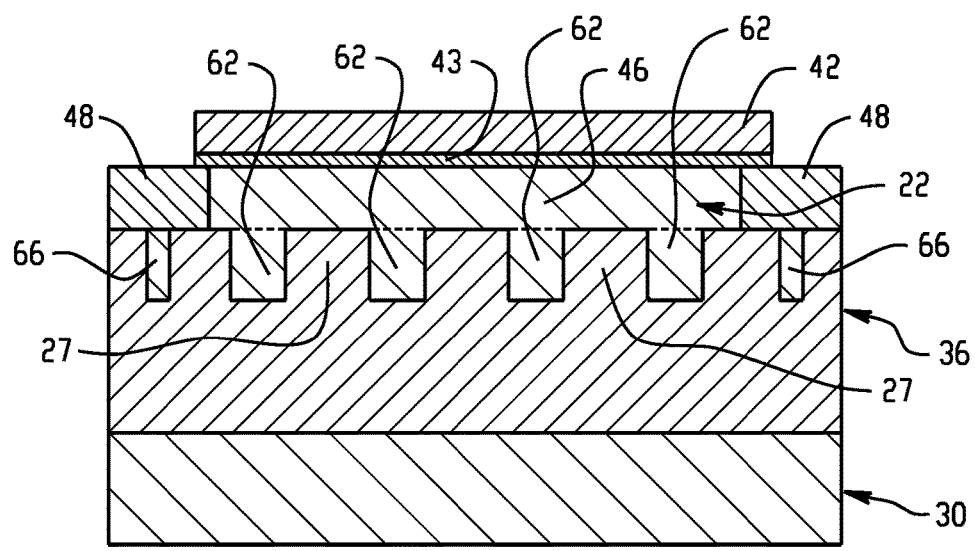
FIG. 10 is a cross-sectional view taken generally along line 10-10 in FIG. 7.
Figure 11:
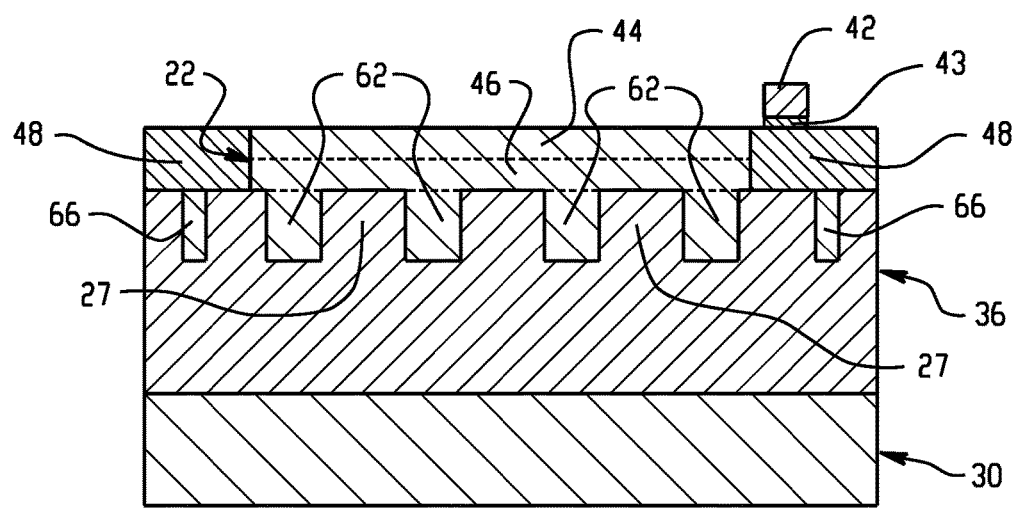
FIG. 11 is a cross-sectional view taken generally along line 11-11 in FIG. 7.
Figure 12:
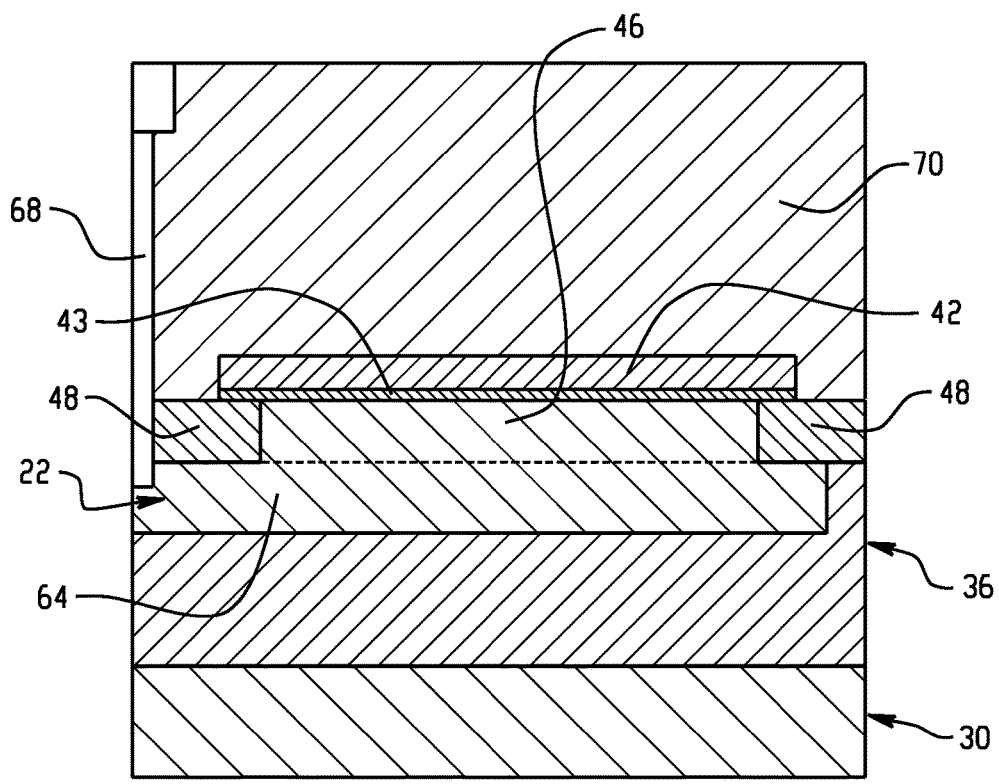
FIG. 12 is a cross-sectional view taken generally along line 12-12 in FIG. 7.

With reference to FIG. 6 in which like reference numerals refer to like features in FIG. 5 and at a subsequent fabrication stage, device structures 40 are formed using the section 22 of semiconductor layer 14 and, in a representative embodiment, the device structures 40 may be field-effect transistors. Each of the representative device structures 40 includes a gate electrode 42, a gate dielectric 43 positioned between the gate electrode 42 and the section 22 of the semiconductor layer 14, and heavily-doped source/drain regions 44 formed in the semiconductor material of section 22 of the semiconductor layer 14 adjacent to the gate electrode 42. Source/drain regions 44 are located on opposite sides of each gate electrode 42. The source/drain regions 44 of a given device structure 40 are separated by a channel defined in a well region 46 in the semiconductor material of section 22 of the semiconductor layer 14. Each channel is located beneath one of the gate electrodes 42 and supports carrier flow between the source/drain regions 44 when a control voltage is supplied to the associated gate electrode 42. The well region 46 constitutes the portion of section 22 of the semiconductor layer 14 that is not occupied by source/drain regions 44. The semiconductor material constituting the well region 46 and the channels may be doped to have a conductivity type opposite to the conductivity type of the semiconductor material contained in the source/drain regions 44.

The gate electrode 42 and gate dielectric 43 of the device structures 40 may be formed by depositing a layer stack and patterning the layer stack with photolithography and etching, and may be arranged in parallel fingers that are wired in parallel at one end. The gate electrodes 42 may be composed of a conductor, such as a metal, doped polycrystalline silicon (polysilicon), or a layered stack of these and other conductive materials. The source/drain regions 44 may be formed in a self-aligned manner by implantation or diffusion of a suitable dopant, such as a Group V dopant like arsenic (As) or phosphorous (P) for n-type conductivity or a Group III dopant like boron (B) for p-type conductivity, into the semiconductor material of section 22 of the semiconductor layer 14. The gate dielectric 43 may be composed of an electrical insulator including, but not limited to, silicon dioxide ($SiO_2$), a high-k dielectric material such as hafnium oxide ($HfO_2$), or layered stacks of these and other dielectric materials. The device structures 40 may include other elements, such as halo regions and lightly doped drain (LDD) extensions in section 22 of the semiconductor layer 14, and non-conductive spacers (not shown) formed on the vertical sidewalls of the gate electrodes 42.

The islands 24 of the semiconductor layer 14 may receive a concentration of a dopant during the fabrication of the device structures 40. The dopant, when activated, will reduce the electrical resistance of the islands 24. For example, the islands 24 of the semiconductor layer 14 may receive a diffused dopant from either the well region 46, which is formed by ion implantation of section 22 of the semiconductor layer 14 during the fabrication of the device structures 40 prior to the formation of the source/drain regions 44.

Trench isolation regions 48, which supply electrical isolation for the device structures 40, may be formed in section 22 of the semiconductor layer 14. The trench isolation regions 48 may be formed by etching trenches in section 22 of the semiconductor layer 14, depositing a dielectric material to fill the trenches, and planarizing the dielectric material using, for example, CMP. The depth of the trenches used to form the trench isolation regions 48 may be controlled by end-pointing on the dielectric material of the BOX layer 36. The dielectric material comprising the trench isolation regions 48 may be silicon dioxide ($SiO_2$), or another electrical insulator, deposited by CVD. The trench isolation regions 48 may be arranged to intersect the top surface of the BOX layer 36 along the planar interface with the section 22 of the semiconductor layer 14, and to avoid intersecting the islands 24 of the semiconductor layer 14. The islands 24 of the semiconductor layer 14 are buried under the trench isolation regions 48, which may operate to reduce parasitic resistance of a buried body contact formed using the islands 24.

Silicidation, middle-of-line (MOL), and back-end-of-line (BEOL) processing follows, which includes formation of contacts and wiring for a local interconnect structure, and formation of dielectric layers, via plugs, and wiring for an interconnect structure coupled by the interconnect wiring with the device structures 40.

With reference to FIGS. 7-12 in which like reference numerals refer to like features in FIG. 6 and in accordance with an alternative embodiment, the device structures 40 may be arranged in a switch 60 that is formed by front-end-of-line (FEOL) processing using the SOI substrate 34. The gate electrodes 42 of the device structures 40 in the switch 60 are arranged as parallel fingers and are wired together at an end opposite from respective unattached ends. One of the source/drain regions 44 is located in section 22 of semiconductor layer 14 within the space horizontally between each adjacent pair of the gate electrodes 42, and in a plane below the plane of the gate electrodes 42.

The section 22 of semiconductor layer 14, which functions as the SOI layer, is surrounded by the trench isolation regions 48 to define an active device region. The islands 24 (FIG. 6) of semiconductor layer 14 are distributed with an arrangement with the active device region that includes islands 62 that are aligned in one direction, an island 64 that intersects the islands 62 and that is aligned in a direction orthogonal to the direction in which the islands 62 are aligned, and a frame 66 that surrounds the active device region formed in the section 22 of the semiconductor layer 14. The islands 62 are aligned lengthwise parallel to each other in columns having a spaced-apart relationship. The islands 62 intersect the island 64 at spaced-apart locations along the length of the island 64, and the islands 62, 64 intersect the frame 66 at each of their opposite ends. One end of the island 64 extends outside of the closed boundary established by the frame 66. The islands 62, 64 and frame 66 to provide a column-row grid of semiconductor material that is located in a network beneath the section 22 of semiconductor layer 14 and that is separated from the gate electrodes 42 by the section 22 of semiconductor layer 14 and/or the trench isolation regions 48.

Due to their alignment, the islands 62 alternate being located beneath the source/drain regions 44 and being located beneath well regions 46. The island 64 is located beneath one of the well regions 46. The frame 66 is located beneath the trench isolation regions 48.

The islands 62, 64 define interconnected sections of a buried body contact. Each of the gate electrodes 42 is parameterized by a finger width, W. The islands 62 extend perpendicular to the finger width of the gate electrodes 42, and the island 64 extends parallel to the finger width of the gate electrodes 42. The islands 62 have a length, L, that is measured relative to the location of the island 64, and that is less than (i.e., shorter than) the finger width of the gate electrodes 42.

Island 64 may be connected at a given location exterior of the boundary of the frame 66 with a contact 68 such that a bias potential can be applied to the islands 62, 64 and frame 66. Biasing may be effective, for example, to reduce the incidence of device breakdown during, for example, high voltage operation of the switch 60. The island 64 is separated from the overlying gate electrode 42 by one of the well regions 46. The contact 68 may be located at a side edge of the pattern defined by the islands 62, 64 and frame 66, and may extend vertically in a dielectric layer 70 (FIG. 12) that is formed during middle-of-line (MOL) processing. The paths to the contact 68 may be made symmetrical in embodiments in which the islands 62, 64 have a symmetrical arrangement within the frame 66, such as would be the case if island 64 were centered within the frame 66 and the islands 62 had a uniform pitch. The arrangement for the islands 62, 64 and frame 66 can be selected when the semiconductor layer 14 is patterned.

The contact 68 to the buried body contact region and, specifically to island 64, may be made through one of the trench isolation regions 48. The contact 68 may be a tungsten (W) contact formed in the dielectric layer 70 during MOL processing. Alternatively, the contact 68 may comprise a polysilicon-filled region extending through the trench isolation region 48 or a polysilicon-filled region in the BOX layer 36 that contacts the handle wafer 30. The contact 68 may be relocated to contact one of the islands 62 instead of island 64.

The islands 62, 64 and frame 66 of semiconductor layer 14 collectively provide a buried body contact that improves linearity for large aspect ratio devices such as the switch 60. The finger width of the gate electrodes 42 may be lengthened due to the island arrangement of the body contact beyond the linear dimension of finger widths permitted by conventional body contacts. The multiplicity of the multiple paths to the contact 68 may operate to reduce the parasitic resistance of the switch 60.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a handle wafer;
    a buried oxide layer on the handle wafer; and
    a semiconductor layer on the buried oxide layer, the semiconductor layer including a section with a top surface, a first island projecting from the section into the buried oxide layer, and a plurality of second islands projecting from the section into the buried oxide layer, wherein the section of the semiconductor layer is located vertically between the islands of the semiconductor layer and the top surface of the semiconductor layer, the first island is aligned in a first direction, the second islands are aligned in a second direction orthogonal to the first direction and that are interconnected with the first island, and the second islands intersect the first island at spaced-apart locations along a length of the first island.

2. The structure of claim 1 further comprising:
    a device structure associated with the section of the semiconductor layer.

3. The structure of claim 2 wherein the device structure is a field-effect transistor having a gate electrode with a finger width, and the first island is aligned parallel to the finger width.

4. The structure of claim 2 wherein the device structure is a field-effect transistor having a gate electrode with a finger width, and the second islands are aligned perpendicular to the finger width.

5. The structure of claim 2 wherein the device structure is a field-effect transistor having a gate electrode with a finger width, the first island is aligned parallel to the finger width, and the second islands are aligned perpendicular to the finger width.

6. The structure of claim 5 wherein the semiconductor layer includes a third island comprising a frame that surrounds the first island and the second islands, and further comprising:
    an electrical connection coupled with the first island.

7. The structure of claim 6 wherein the device structure is a field-effect transistor having a gate electrode, the gate electrode is located inside the frame, and the electrical connection is located outside of the frame.

8. The structure of claim 6 wherein the second islands have a length that is less than the finger width.

9. The structure of claim 2 wherein the device structure is a field-effect transistor having a gate electrode and a gate dielectric between the gate electrode and the section of the semiconductor layer, and the section of the semiconductor layer is located vertically between the second islands and the gate dielectric.

10. The structure of claim 1 wherein the first island and the second islands of semiconductor material are horizontally separated from each other by portions of the buried oxide layer.

11. The structure of claim 1 further comprising:
a trench isolation region extending through the section of the semiconductor layer to the buried oxide layer,
wherein the first island and the second islands are located vertically between the trench isolation and the handle wafer.

12. A method comprising:
forming a cleavage plane in a first wafer that is separated from a surface of the first wafer by a semiconductor layer;
patterning a surface of the first wafer to form a plurality of trenches in the semiconductor layer, a first island that is aligned in a first direction, and a plurality of second islands that are aligned in a second direction orthogonal to the first direction and that are interconnected with the first island, wherein the second islands intersect the first island at spaced-apart locations along a length of the first island;
depositing a dielectric layer that fills the trenches and that covers the semiconductor layer, the first island, and the second islands; and
transferring the dielectric layer and the semiconductor layer to a second wafer by bonding the dielectric layer to a second wafer and separating along the cleavage plane.

13. The method of claim 12 further comprising:
after the dielectric layer and the semiconductor layer are transferred to the second wafer, forming a device structure associated with the semiconductor layer.

14. The method of claim 13 wherein the semiconductor layer includes including a top surface and a section vertically between the second islands and the top surface, and the first island and the second islands project into the dielectric layer at respective locations horizontally between the trenches.

15. The method of claim 14 further comprising:
forming a plurality of trench isolation regions that extend through the section of semiconductor material to the dielectric layer.

16. The method of claim 14 wherein the device structure is a field-effect transistor having a gate electrode with a finger width, at least one of the islands is aligned parallel to the finger width, and the first island is aligned parallel to the finger width.

17. The structure of claim 16 wherein the second islands have a length that is less than the finger width.

18. The method of claim 14 further comprising:
forming a trench isolation region extending through the section of the semiconductor layer to the buried oxide layer,
wherein the first island and the second islands are located vertically between the trench isolation and the handle wafer.

19. The structure of claim 13 wherein the device structure is a field-effect transistor having a gate electrode and a gate dielectric between the gate electrode and the section of the semiconductor layer, and the section of the semiconductor layer is located vertically between the second islands and the gate dielectric.

* * * * *

UNITED STATES PATENT AND TRADEMARK OFFICE
CERTIFICATE OF CORRECTION

| | | |
|---|---|---|
| PATENT NO. | : 10,062,711 B2 | Page 1 of 1 |
| APPLICATION NO. | : 15/386507 | |
| DATED | : August 28, 2018 | |
| INVENTOR(S) | : Steven Shank et al. | |

It is certified that error appears in the above-identified patent and that said Letters Patent is hereby corrected as shown below:

In the Claims

At Column 10, Claim number 14, Line number 6, after "includes" delete "including"

Signed and Sealed this
Second Day of October, 2018

Andrei Iancu
*Director of the United States Patent and Trademark Office*